United States Patent
Ishida

(10) Patent No.: US 6,723,660 B1
(45) Date of Patent: Apr. 20, 2004

(54) THIN-FILM FORMING APPARATUS AND THIN-FILM FORMING METHOD

(75) Inventor: Arichika Ishida, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/528,452

(22) Filed: Mar. 17, 2000

(30) Foreign Application Priority Data

Mar. 18, 1999 (JP) .......................................... 11-074041

(51) Int. Cl.⁷ ....................... H01L 21/31; H01L 21/469
(52) U.S. Cl. ...................... 438/758; 438/784; 438/788; 438/783
(58) Field of Search .............................. 438/784, 788, 438/758, 783

(56) References Cited

U.S. PATENT DOCUMENTS

| | | | | |
|---|---|---|---|---|
| 5,135,608 A | * | 8/1992 | Okutani | 438/584 |
| 5,288,518 A | * | 2/1994 | Homma | 427/255.29 |
| 5,296,036 A | * | 3/1994 | Matsuyama et al. | 118/718 |
| 5,314,724 A | * | 5/1994 | Tsukune et al. | 427/489 |
| 5,527,391 A | * | 6/1996 | Echizen et al. | 118/719 |
| 5,591,486 A | * | 1/1997 | Okano et al. | 427/255.28 |
| 5,660,895 A | * | 8/1997 | Lee et al. | 427/579 |
| 5,800,877 A | * | 9/1998 | Maeda et al. | 427/535 |
| 5,877,086 A | * | 3/1999 | Aruga | 438/653 |
| 5,951,772 A | * | 9/1999 | Matsuse et al. | 118/723 R |
| 5,968,379 A | * | 10/1999 | Zhao et al. | 219/121.52 |
| 5,976,260 A | * | 11/1999 | Kinoshita et al. | 118/719 |
| 6,121,162 A | * | 9/2000 | Endo | 438/787 |
| 6,189,482 B1 | * | 2/2001 | Zhao et al. | 118/723 R |
| 6,194,037 B1 | * | 2/2001 | Terasaki et al. | 427/569 |
| 6,207,536 B1 | * | 3/2001 | Matsumoto et al. | 438/478 |
| 6,313,430 B1 | * | 11/2001 | Fujioka et al. | 219/121.57 |
| 6,338,874 B1 | * | 1/2002 | Law et al. | 427/255.18 |
| 6,391,114 B1 | * | 5/2002 | Kirimura | 118/719 |
| 6,410,454 B1 | * | 6/2002 | Muranaka et al. | 438/758 |
| 6,432,479 B2 | * | 8/2002 | Chang et al. | 427/255.394 |
| 2001/0015173 A1 | * | 8/2001 | Matsumoto et al. | 118/715 |

FOREIGN PATENT DOCUMENTS

| | | | |
|---|---|---|---|
| JP | 404192414 A | * | 7/1992 |
| JP | 4-343414 | | 11/1992 |
| JP | 7-235506 | | 9/1995 |

* cited by examiner

*Primary Examiner*—Matthew Smith
*Assistant Examiner*—Chuong A Luu
(74) *Attorney, Agent, or Firm*—Pillsbury Winthrop LLP

(57) ABSTRACT

A thin-film forming apparatus of the present invention is capable of reducing variation of film formation rate and forming thin films of a stable thickness. The thin-film forming apparatus can prevent decrease of the film formation rate due to raise of temperatures of an RF electrode and an inner wall of a reaction chamber, by supplying a pressure control gas of a predetermined pressure into the reaction chamber also in non-film formation time to keep a gas pressure in the reaction chamber constant. Thereby, thickness of a film grown on a substrate can be controlled to a constant thickness. Further, by heating the pressure control gas to raise its temperature to a value approximately equal to a temperature of a material gas, variation of the pressure of the gas in the reaction chamber is controlled and the temperatures of the inner wall of the reaction chamber and the RF electrode are kept constant. Thereby, since the film formation rate on the inner wall of the reaction chamber and a surface of the RF electrode are kept constant, the quantity of the material gas substantially supplied to the surface of the substrate is kept constant. Thereby, the film formation rate on the surface of the substrate can be kept constant.

5 Claims, 3 Drawing Sheets

THIN-FILM FORMING APPARATUS AND THIN-FILM FORMING METHOD

CROSS-REFERENCE TO RELATED APPLICATION

This application is based upon and claims the benefit of priority from the prior Japanese Patent Application No. 11-074041, filed Mar. 18, 1999, the entire contents of which are incorporated herein by reference.

BACKGROUND OF THE INVENTION

This invention relates to a thin-film forming apparatus and a thin-film forming method used for manufacturing electronic devices.

A thin-film forming apparatus, wherein a reactive gas is introduced into a reaction chamber and the introduced reactive gas is activated by plasma and light to form a thin film, is widely used for manufacturing electronic devices.

In a thin-film forming apparatus, a substrate is loaded in a reaction chamber to which a material gas is supplied under a predetermined pressure, and the material gas is activated by applying a high-frequency electric power to grow a film of growth seeds in the material gas on the substrate.

In a thin-film forming apparatus, if a film forming method wherein a film formation rate depends on the supply quantity of the material gas is used, as shown in a curve (b) in FIG. 4, it is well known that the thickness of a film grown on a substrate is liable to vary by variation of the film formation rate.

Further, curve (b) of FIG. 4 indicates a film thickness of each substrate, in the case where a gas obtained by mixing TEOS and oxygen at a predetermined ratio is used as the material gas, and the reaction chamber is evacuated for three hours and thereafter film formation for two minutes and substrate transfer are repeated at a timing shown in FIG. 3.

The curve (b) of FIG. 4 shows that film thickness decreases (film formation rate decreases) as film formation is repeated. Specifically, it is difficult to provide substrates having constant and stable characteristics.

Therefore, if these substrates are used for an electronic device which is an end product, there are problems that operation of the electronic device is not stabilized, and that characteristics vary between devices.

BRIEF SUMMARY OF THE INVENTION

The object of the present invention is to provide a thin-film forming apparatus and a thin-film forming method, which decrease variation of film formation rate and can form thin films having stable film thickness.

The present invention has been made in consideration of the above problems, which provides a thin film, comprising the steps of: supplying a material gas into a reaction chamber; and forming a thin film on a substrate with a predetermined pressure, wherein a pressure control gas having no ability to independently forming a film is supplied into the reaction chamber in a thin-film non-formation time period before forming the thin film, thereby controlling the pressure in the reaction chamber to be substantially equal to the predetermined pressure.

Further, the thin film, comprising the steps of: supplying a material gas into a reaction chamber having a heating mechanism on which a substrate is set and an electrode disposed to face the heating mechanism; and forming a thin film on the substrate, wherein the heating mechanism is in a heating state in a thin-film non-formation time period before forming the thin film, and a pressure control gas having no ability to independently forming a film is supplied to the reaction chamber in order to prevent an increase of a temperature of the electrode.

Further, the thin-film forming apparatus comprising: a reaction chamber having a heating mechanism on which a substrate is set and an electrode disposed to face the heating mechanism; a material gas introducing mechanism for supplying a material gas for film formation into the reaction chamber; and a pressure control gas introducing mechanism for supplying into the reaction chamber a pressure control gas for pressure control in the reaction chamber in a thin-film non-formation period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

Figure 1:
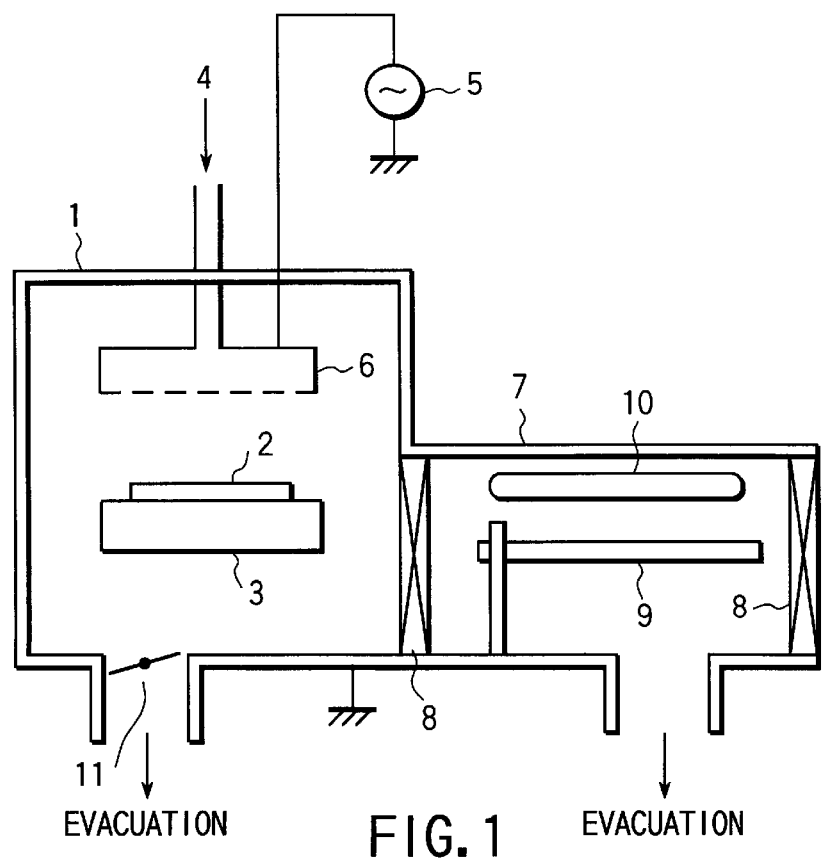
FIG. 1 is a schematic view showing operation of a film forming apparatus to which an embodiment of the present invention is applied.

A load-lock chamber 7 is connected to the reaction chamber 1 via a gate valve 8. The load-lock chamber 7 is provided with a transfer mechanism 9 for transferring the substrate 2, and a heater 10.

In such a film forming-apparatus, the substrate 2 which has been heated to a predetermined temperature in the load-lock chamber 7 by the heater 10 is transferred by the transfer mechanism 9 into the reaction chamber 1 evacuated in advance.

Next, reactive gas is introduced into the reaction chamber 1 via the inlet 4. At this time, the reactive gas is uniformly diffused in the reaction chamber 1 by a plurality of pores provided at the surface of the shower plate 6.

Then, a high-frequency electric power is supplied from the power supply 5 to the shower plate 6, and thereby electric discharge is produced in the reaction chamber 1 and plasma is produced.

Figure 2:
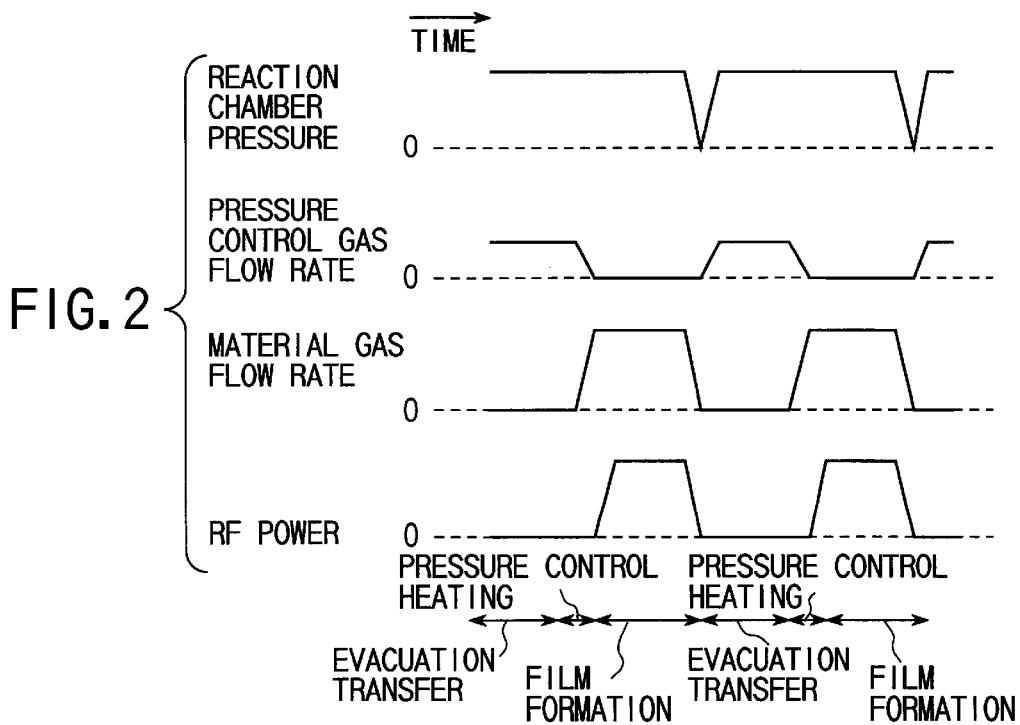
FIG. 2 is a timing chart for describing a film forming method of the present invention applied to the film forming apparatus shown in FIG. 1.
Figure 3:
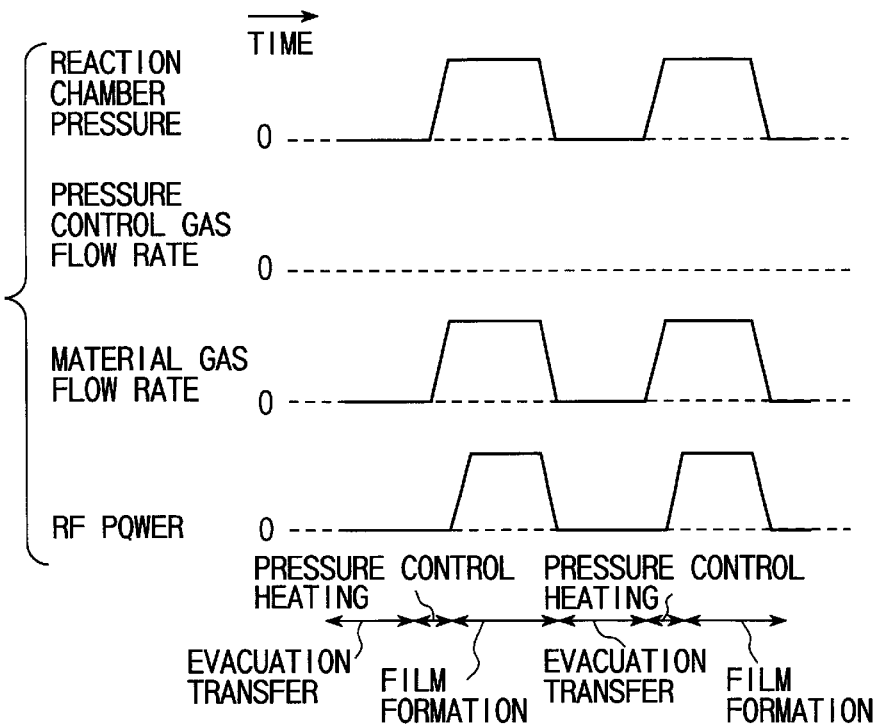
FIG. 3 is a timing chart for describing the difference between the film forming method of the in a predetermined position in the reaction chamber 1. Reactive gas and pressure control gas are supplied to the reaction chamber 1 via a gas inlet 4. Further, the substrate 2 settled in the reaction chamber 1 is irradiated with high-frequency electric power (RF) at a predetermined frequency via a shower plate (RF electrode) 6 connected to a power supply 5.
Figure 4:
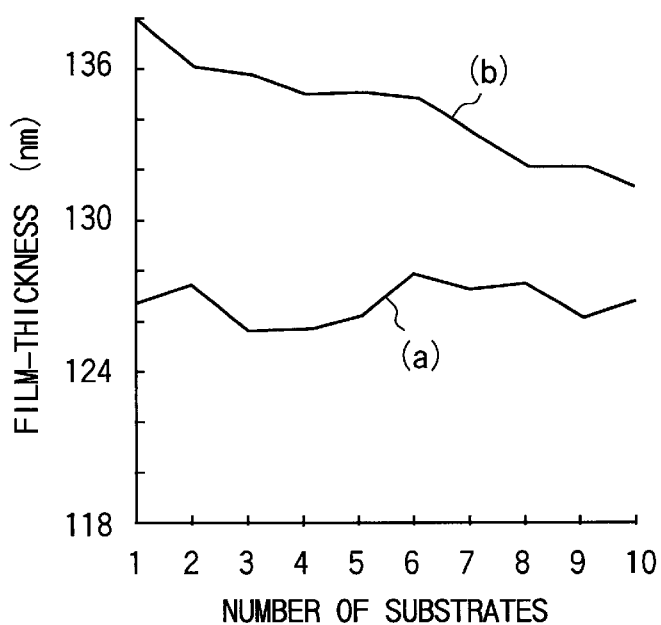
Figure 5:
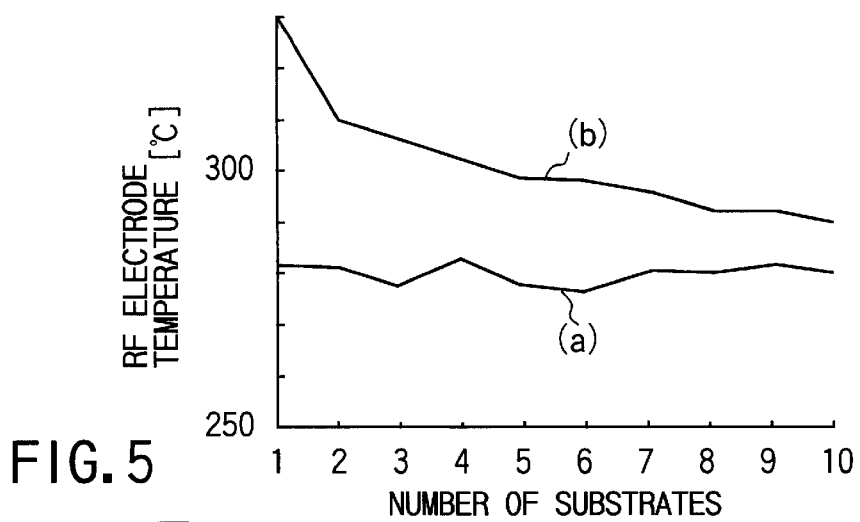
Figure 6:
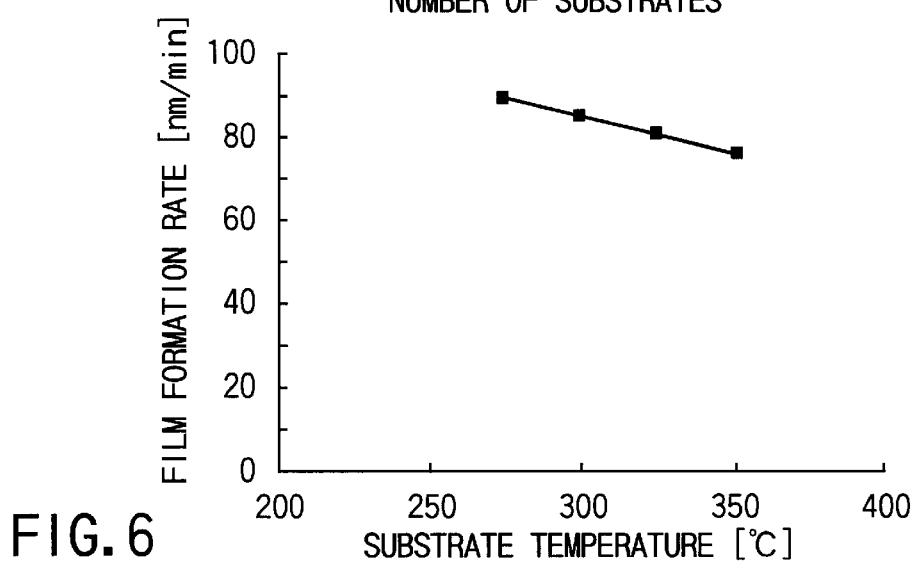
Figure 7:
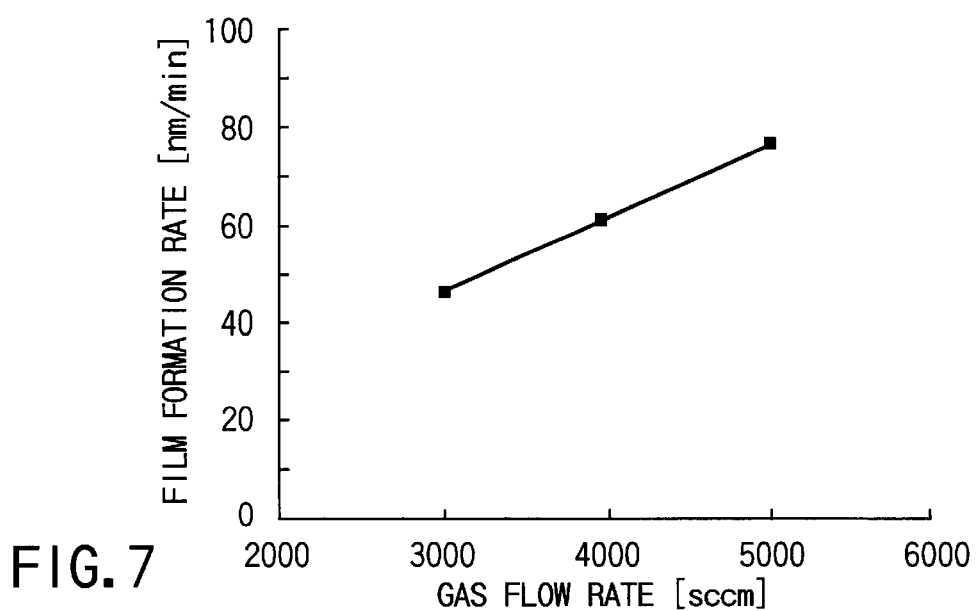

The material gas is decomposed by this plasma to generate active seeds, and a film is grown on the present invention applied to the film forming apparatus shown in FIG. 1 and a well-known film forming method;

FIG. 4 is a schematic view showing a degree of variation of thickness of each film obtained by the film forming method of the present invention shown in FIG. 2 and the well-known film forming method shown in FIG. 3;

FIG. 5 is a schematic view showing one of factors of the variation of film thickness shown in FIG. 4;

FIG. 6 is a schematic view showing one of the factors of the variation of film thickness shown in FIG. 4; and FIG. 7 is a schematic view showing one of the factors of the variation of film thickness shown in FIG. 4.

DETAILED DESCRIPTION OF THE INVENTION

An embodiment of the present invention will now be described with reference to the accompanying drawings.

FIG. 1 is a schematic view showing an example of a thin-film forming apparatus to which an embodiment of the present invention is applicable.

As shown in FIG. 1, the thin-film forming apparatus (hereinafter abbreviated as "film forming apparatus") comprises a reaction chamber 1 into which reactive gas is introduced.

A substrate heater 3 for supporting and heating substrate 2 to a predetermined temperature is provided substrate 2.

In the meantime, as already described, it is known that film forming rate often varies in a film forming apparatus. This variation of the film forming rate becomes particularly remarkable in a film forming method wherein the film forming rate depends on the supply quantity of the gas. This is explained by the fact that the film thickness becomes thinner as the number of repeating times of film formation increases, as shown by the film thickness obtained by the well-known film forming method and indicated by the curve (b) in FIG. 4.

FIG. 2 is a timing chart for describing a film forming method by the film forming apparatus shown in FIG. 1. FIG. 3 is an example of a timing chart for describing a film forming method by a well-known film forming apparatus to be compared with the film forming method by the film forming apparatus of the present invention shown in FIG. 2.

As shown in FIG. 2, prior to start of the film formation on the substrate by using the material gas, a pressure control gas of a kind different from the material gas (it may be of the same kind) is supplied into the reaction chamber 1 to control the pressure in the reaction chamber 1. The pressure of the pressure control gas is set to be approximately equal to the pressure of the material gas supplied in film formation.

Next, the substrate 2 heated in advance in the load-lock chamber 7 is transferred into the reaction chamber 1 by the transfer mechanism 9. The pressure control gas is also supplied during transfer time in order to maintain the constant pressure of the pressure control gas in the reaction chamber 1.

Thereafter, the supply of the pressure control gas is stopped and the material gas is supplied. When the pressure of the material gas reaches a predetermined level, an RF output is applied from the power supply 5 to the shower plate 6, and the components of the material gas is formed as a film (a film is grown) on the substrate 2.

Immediately after the film formation is completed, the reaction chamber is once evacuated, and the pressure control gas is supplied for film formation on the following substrate 2.

As described above, film formation on each substrate 2 is repeated successively.

According to the film forming method by the film forming apparatus of the present invention shown in FIG. 2, the time required for reducing the pressure in the reaction chamber to "zero" is little in comparison with the well-known film forming method as shown in FIG. 3.

The curve (a) in FIG. 4 shows variation of the film thickness of each substrate 2 on which a film is formed by the process explained by using FIG. 2. The curve (a) shows that an almost constant film thickness is obtained in regardless of film forming order. Specifically, as shown in the curve (b) in FIG. 4, in a conventional film forming method, the film forming rate decreases and film thickness decreases as film formation is repeated. However, as is clear from the curve (a), according to the film forming method of the present invention shown in FIG. 2, an almost constant film thickness can be obtained in regardless of the number of times of repeating film formation (the number of substrates).

The curve (a) in FIG. 4 shows the variation of film thickness of substrate 2 obtained by: evacuating the reaction chamber 1 for three hours and thereafter supplying 500 sccm $N_2$ (gaseous nitrogen) per minute into the reaction chamber 1 as the pressure control gas; setting the pressure of the pressure control gas to 160 Pa by a valve device 11 and leaving it for one hour; thereafter transferring the substrate 2 into the reaction chamber 1 and supplying 5000 sccm material gas per minute, the material gas obtained by mixing TEOS (tetraethoxysiran) and $O_2$ (oxygen) with a ratio of 1:500; and forming a film for two minutes by high-frequency electric power of 0.5 W/cm$^2$ from the shower plate 6. Further, the pressure of the material gas is controlled to 160 Pa to be almost equal to the pressure of the pressure control gas.

In the meantime, in the case of using material gas which is in liquid phase at the normal temperature such as TEOS gas, the material gas is usually heated by the substrate heater 3. Therefore, the pressure control gas is desirably heated to the same temperature as that of the material gas. By heating the pressure control gas to a temperature equivalent to that of the material gas, constancy of the thickness of the formed films can be further heightened.

As described above, 500 sccm per minute of pressure control gas $N_2$ is supplied into the reaction chamber 1 in non-film formation time, and 5000 sccm per minute of the material gas in film formation time. In both of the non-film formation time and the film formation time, the pressure of the gas in the reaction chamber 1 is maintained at a predetermined pressure (160 Pa in this embodiment), and thereby the film forming rate can be controlled to an almost constant rate. Specifically, variation of thickness of film grown on substrate 2 due to the film formation order can be prevented.

FIGS. 5–7 are graphs showing factors for explaining the reason why the film formation rate is maintained at a certain rate by maintaining the gas pressure almost constant in the reaction chamber 1 of the film forming apparatus shown in FIG. 1 (reason why the thickness of the film does not vary regardless of the film formation order). FIG. 5 shows change of a temperature of the shower plate (RF electrode) 6 when the number of substrates on which a film is formed is used as parameter. The curve (b) of FIG. 5 shows a temperature of the RF electrode in the well-known film forming method described above.

As shown in FIG. 5, in the film forming method of the present invention shown in FIG. 2, the temperature of the RF electrode (shower plate) 6 is maintained almost constant. However, in the well-known film forming method, FIG. 5 shows that the temperature of the RF electrode decreases by about 100° C. (25%) during film formation for ten substrates, for example.

This matter shows that change of the temperature of the RF electrode 6 can be mentioned as a factor controlling the film formation rate.

Based on the result shown in FIG. 5, FIG. 6 is a graph showing the relationship between a substrate temperature and film formation rate, in the case where a gas obtained by mixing TEOS and oxygen at the ratio of 1:500 is supplied as the material gas by 5000 sccm per minute during film formation, the gas pressure in the reaction chamber 1 is 160 Pa, RF power [high-frequency electric power supplied from the power supply 5 to the shower plate (RF electrode) 6] is 0.5 W/cm$^2$, and film formation time is 2 minutes.

As is clear from FIG. 6, when the substrate temperature is low, the film formation rate is higher than that in the case where the substrate temperature is high.

This matter shows that the thickness of film formed on substrate is controlled by the temperature of the substrate.

FIG. 7 is a graph showing change of film formation rate in the case where the substrate temperature is maintained at 350° C. under the same conditions as those for obtaining the temperature characteristics of FIG. 6 and the flow rate of gas is changed.

As shown in FIG. 7, when the flow rate of the material gas increases, film formation rate rises.

From FIGS. 5–7, in the well-known film forming method, factors for which film thickness varies in accordance with the film formation order are:

a) in the state where the RF electrode is heated by radiation from the heater 3 in the non-film formation time (while supply of the pressure control gas is stopped), the material gas is supplied and thereby thermal conductivity of the inner wall of the reaction chamber 1 above the RF electrode increases;

b) consequently, the temperature of the RF electrode temporarily decreases;

c) by reduction of the temperature of the RF electrode, the growth rate of film formed on the RF electrode increases;

d) By increase of (thickness of) film formed on the RF electrode, the material gas substantially supplied to the substrate decreases.

This matter shows that constant thickness (film formation rate) of film formed on the substrate 2 can be maintained, by controlling (maintaining constant or in a certain range) variation of the temperature of the RF electrode or the inner wall of the reaction chamber 1 by heating or cooling the RF electrode 6 or the inner wall of the reaction chamber 1, for example. However, a structure for heating or cooling the RF electrode is not suitable for practical use since it complicates the structure of the film forming apparatus, in particular, the structure around the reaction chamber.

In the meantime, the factor of change of the temperature of the RF electrode 6 can be regarded from FIGS. 5–7 as being change of thermal conductivity of the area between the inner wall of the reaction chamber 1 and the RF electrode. Therefore, as shown in FIG. 2, films of almost constant thickness can be formed on the substrates 2 by controlling the increase of the temperature of the RF electrode 6 by supplying the pressure control gas into the reaction chamber 1 before supplying the material gas into the reaction chamber 1. Further, a most important thing is to maintain the gas pressure in the reaction chamber 1 at a constant value, and the kind of gas is not specially restricted. Therefore, the pressure control gas may be of the same kind as that of the material gas.

However, a running cost can be reduced by using an inexpensive gas such as $N_2$ as the pressure control gas, which is also useful for reducing the cost of electronic devices which are end products.

Further, in order to keep the pressure of the gas in the reaction chamber at a constant value, the gas may be sealed without evacuation. However, in order to prevent accumulation of impurity in the reaction chamber, it is preferable to continuously supply gas of a constant flow rate while a part of the gas is discharged.

Furthermore, in the case of using gas which is in liquid phase at a normal temperature such as TEOS gas, the stability of thickness of the formed film can be further increased (the degree of variation can be reduced) by keeping the pressure control gas at the same temperature as that of the material gas.

Moreover, by heating the substrate 2 by the substrate heater 3, the variation of the temperatures of the wall surface in the reaction chamber 1 and the RF electrode 6 can be prevented, and the film formation rate of the inner wall of the reaction chamber 1 and the surface of the RF electrode 6 is kept constant. Therefore, the quantity of the material gas substantially supplied to the surface of the substrate 2 is kept constant, and thereby the film formation rate grown on the surface of the substrate 2 is controlled constant.

In the above embodiment, film formation by means of plasma CVD was described. However, the factors of variation of film thickness, which have been described by using FIGS. 5–7, are the same in various film forming methods wherein film formation rate strongly depends on the flow rate of the material gas. The present invention is also applicable to another film forming method wherein light or heated catalyst is used as means for activating the material gas.

As described above, the film forming apparatus (thin-film forming apparatus) of the present invention can prevent decrease of film formation rate due to increase of the temperatures of the RF electrode and the inner wall of the reaction chamber, by supplying pressure control gas under a predetermined pressure into the reaction chamber in the non-film formation time to keep the gas pressure in the reaction chamber at a constant value. Thereby, films of a constant thickness can be formed.

In other words, according to the thin-film forming apparatus of the present invention, by preventing variation of the temperatures of the inner wall surface of the reaction chamber and the RF electrode, the film formation rate on the inner wall of the reaction chamber and the surface of the RF electrode is kept constant, and the quantity of the material gas substantially supplied to the surface of the substrate can be kept constant. Thereby, the film formation rate on the substrate is kept constant. Therefore, variation of the thickness of the film formed on the substrate due to the film forming order is prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming thin film on a substrate, comprising:

(i) transferring a substrate into a reaction chamber
(ii) supplying a material gas into the reaction chamber;
(iii) setting a pressure in the reaction chamber to a predetermined pressure;
(iv) keeping a temperature of an RF electrode constant to form a thin film on the substrate;
(v) transferring the substrate on which the thin film has been formed outside the reaction chamber; and
repeating said (i), (ii), (iii), (iv) and (v) for processing a plurality of substrates;
wherein a pressure control gas having no ability to independently form a film is supplied into the reaction chamber before forming the thin film, thereby controlling the pressure in the reaction chamber to be substantially equal to the predetermined pressure, and
the pressure control gas is supplied into the reaction chamber during forming the thin film on each of the substrates to keep the temperature on the RF electrode substantially constant.

2. A method according to claim 1, wherein a temperature of the pressure control gas and a temperature of the material gas are set to be substantially equal to each other.

3. A method according to claim 2, wherein the material gas is in a gas phase obtained by heating a liquid.

4. A method according to claim 1, wherein, in the step of controlling the pressure in the reaction chamber to be substantially equal to the predetermined pressure, the pressure control gas is supplied while a part of the pressure control gas is discharged.

5. A method of forming thin film, comprising:
transferring a substrate into a reaction chamber having a heating mechanism and an electrode disposed to face the heating mechanism;
supplying a material gas into the reaction chamber; and
supplying a pressure control gas which does not have the independent ability to form a thin film, into the reaction chamber which maintains the temperature of the electrode substantially constant.

* * * * *